United States Patent
Wang et al.

(10) Patent No.: US 7,736,823 B1
(45) Date of Patent: Jun. 15, 2010

(54) METHOD AND SYSTEM FOR PROVIDING OPTICAL PROXIMITY CORRECTION FOR STRUCTURES SUCH AS A PMR NOSE

(75) Inventors: Yizhong Wang, San Jose, CA (US); Hai Sun, Milpitas, CA (US); Hongping Yuan, Fremont, CA (US); Winnie Yu, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 438 days.

(21) Appl. No.: 11/801,916

(22) Filed: May 11, 2007

(51) Int. Cl.
*G03F 1/00* (2006.01)
(52) U.S. Cl. .......................................... 430/5; 430/320
(58) Field of Classification Search .................. 430/5, 430/311, 320–324; 365/120; 360/125.43; 716/19–21
See application file for complete search history.

(56) References Cited

U.S. PATENT DOCUMENTS

| | | | |
|---|---|---|---|
| 5,707,765 A | 1/1998 | Chen | |
| 5,916,423 A | 6/1999 | Westwood | |
| 6,044,007 A * | 3/2000 | Capodieci | ................. 365/120 |
| 6,127,071 A | 10/2000 | Lu | |
| 6,255,040 B1 | 7/2001 | Sasaki | |
| 6,280,887 B1 | 8/2001 | Lu | |
| 6,329,211 B1 | 12/2001 | Terunuma et al. | |
| 6,417,990 B1 | 7/2002 | Zhou et al. | |
| 6,492,078 B1 | 12/2002 | Ohnuma | |
| 6,497,825 B1 | 12/2002 | Kamijima | |
| 6,621,659 B1 | 9/2003 | Shukh et al. | |
| 6,646,828 B1 | 11/2003 | Sasaki | |
| 7,141,338 B2 | 11/2006 | Chen et al. | |
| 2003/0039892 A1* | 2/2003 | Hsieh et al. | ................. 430/5 |

* cited by examiner

*Primary Examiner*—Mark F Huff
*Assistant Examiner*—Stewart A Fraser

(57) ABSTRACT

A mask for transferring a pattern for portion of a magnetic recording transducer is disclosed. The masks includes one corner corresponding to an angle of more than ninety degrees and less than one hundred eighty degrees. The mask also includes at least one rectangular serif residing at the corner.

19 Claims, 5 Drawing Sheets

130

140

METHOD AND SYSTEM FOR PROVIDING OPTICAL PROXIMITY CORRECTION FOR STRUCTURES SUCH AS A PMR NOSE

BACKGROUND OF THE INVENTION

FIG. 1 depicts air-bearing surface (ABS) view of a conventional perpendicular magnetic recording (PMR) transducer 10 used in recording a PMR media (not shown). The conventional PMR transducer 10 is typically used as a write head in a merged head including the conventional PMR transducer 10 and a read head. The conventional PMR transducer 10 includes a conventional first pole (P1) 12, insulator 14, insulator 16, a conventional PMR pole (main pole) 18, write gap 20, and shield 22. The PMR pole 18 has a negative angle, $\Theta$. Thus, the top of the conventional PMR pole 18 is wider than the bottom of the PMR pole 18. FIG. 2 depicts a top view of a portion of the conventional PMR pole 18. Near the ABS, the conventional PMR pole 18 terminates in a nose 19. The conventional PMR pole 18 thus flares outward from the nose 19 at a flare angle, $\phi$, forming corners 21A and 21B. The flare angle, $\phi$, is typically desired to be approximately one hundred and fifty degrees.

FIGS. 3-4 depict a conventional mask 30 and the corresponding conventional resist mask 40, respectively, used in fabricating the PMR pole 18. Referring to FIGS. 2-4, in order to provide the conventional PMR pole 18, photolithography is used. A layer of resist (not shown) is typically spun onto the surface of the conventional PMR transducer 10. The photoresist layer is developed using the conventional mask 30 to block a portion of the light used. The conventional mask 30 has a shape corresponding to the shape desired to be developed. Consequently, the mask 30 includes an aperture 32 corresponding to a nose region, corners 34A and 34B, and a flare angle, $\phi$. Using the conventional mask 30 and light of the appropriate wavelength, the conventional resist mask 40 is developed from the layer of photoresist. Because of the use of the conventional mask 30, the conventional resist mask 40 includes a trench having a nose region 42 and arcs 44A and 44B. The conventional resist mask 40 covers a portion of the conventional PMR transducer 10 during fabrication, allowing the conventional PMR pole 18 to be formed therein. Consequently, the nose 19 having a flared angle, $\phi$, of approximately one hundred fifty degrees may be formed.

Although the conventional mask 30 and conventional resist mask 40 may be used to form the conventional PMR pole 18, there are drawbacks. In particular, the shape of the nose 19 may not be well controlled. Although the conventional mask 30 includes relatively sharp corners 34A and 34B, the corresponding regions of the conventional resist mask, arcs 44A and 44B, are rounded. It is believed that this rounding is due to optical proximity effects during exposure of the resist mask 40. Even though the desired obtuse angle, $\phi$, may be achieved, the rounding adversely affect the PMR pole 18. Because of the rounding in the regions 44A and 44B, the conventional PMR pole 18 also has rounded corners 21A and 21B, respectively. Rounding of the corners 21A and 21B results in variations in the nose 19. For example, variations in the write track width and shape of the pole 18 may result. Consequently, performance of the PMR transducer 10 may suffer.

BRIEF SUMMARY OF THE INVENTION

The present invention provides a mask for transferring a pattern for portion of a magnetic recording transducer. The mask includes one corner corresponding to an angle of more than ninety degrees and less than one hundred eighty degrees. The mask also includes at least one rectangular serif residing at the corner.

According to the method and system disclosed herein, the present invention provides a resist mask having reduced proximity effects near the corner and, therefore, a sharper corresponding corner.

DETAILED DESCRIPTION OF THE INVENTION

Figure 1:
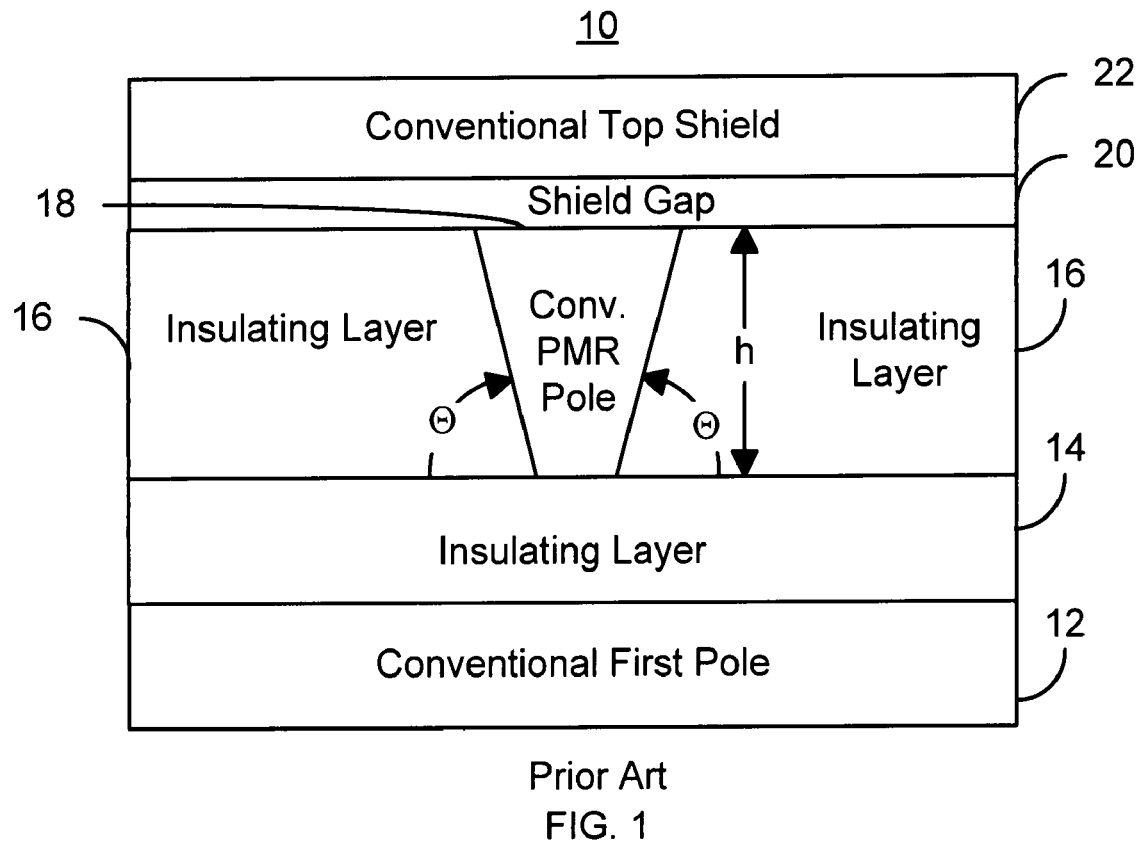
FIG. 1 depicts an ABS view of a conventional PMR transducer.
Figure 2:
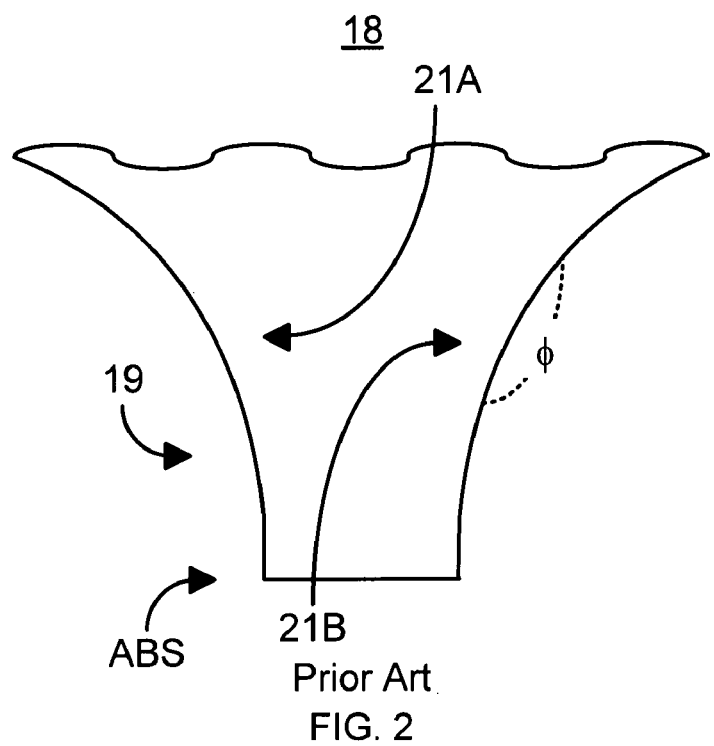
FIG. 2 depicts a top view of a conventional PMR pole.
Figure 3:
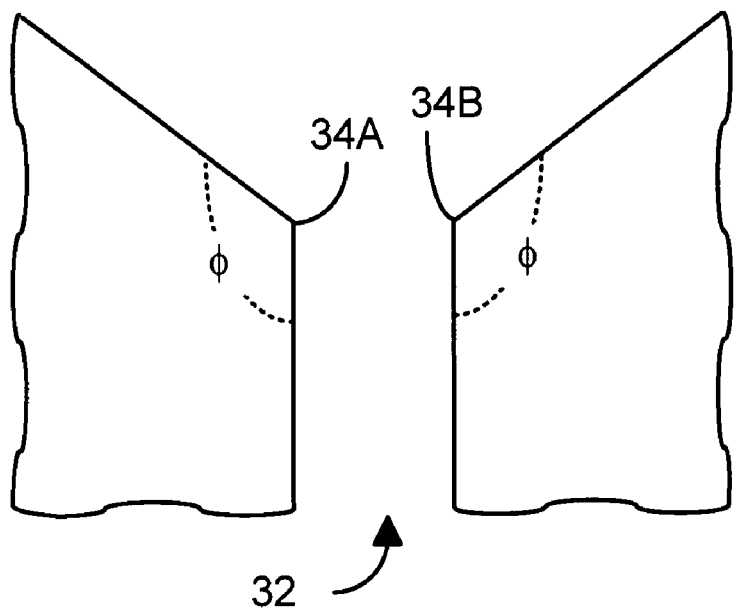
FIG. 3 depicts a conventional mask used in forming the conventional PMR pole.
Figure 4:
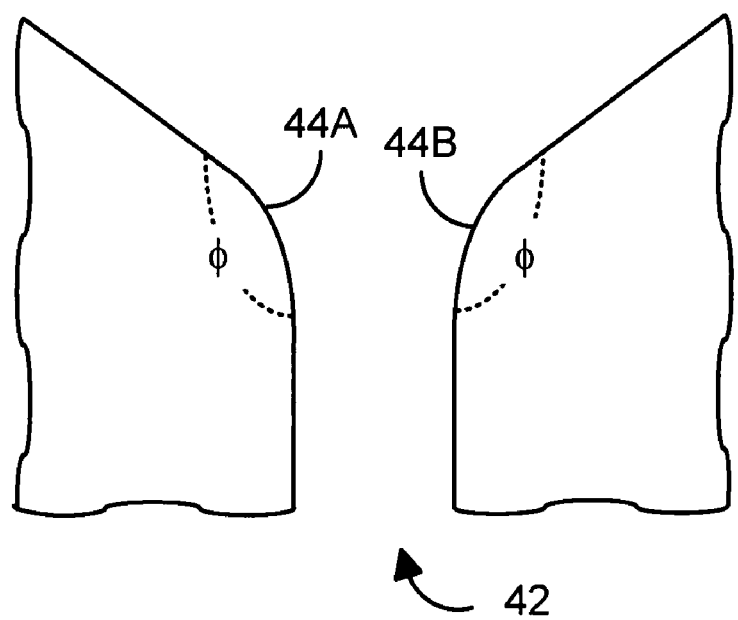
FIG. 4 depicts a conventional resist mask fabricated using the conventional mask.
Figure 5:
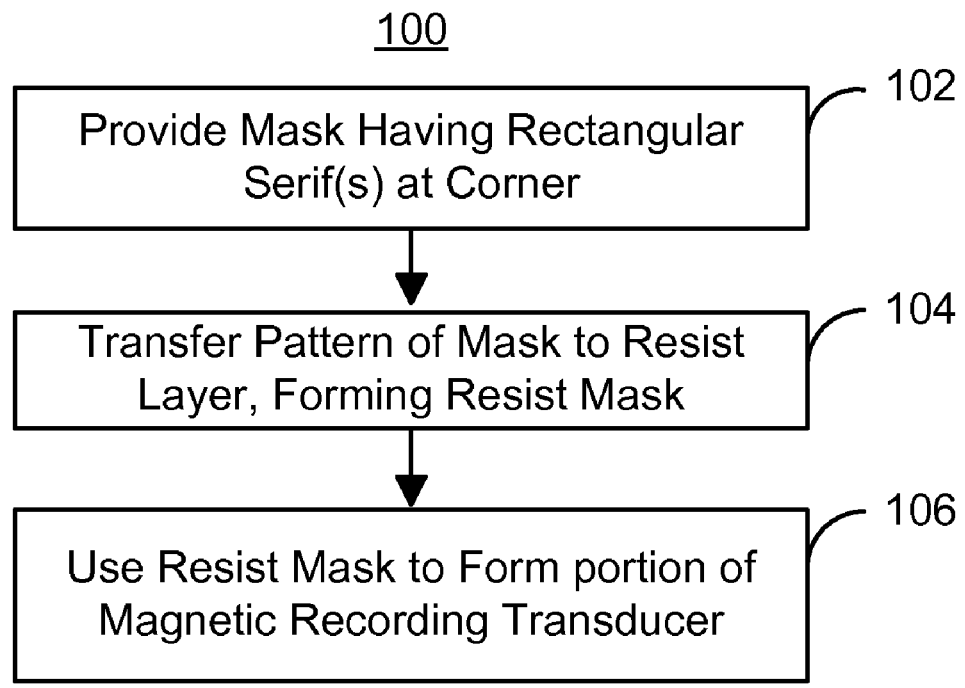
FIG. 5 is a flow chart depicting an exemplary embodiment of a method for forming structures having an obtuse angle, such as a PMR pole.

FIG. 5 is a flow chart depicting an exemplary embodiment of a method 100 for forming structures having an obtuse angle, such as a PMR pole. A mask is provided, via step 102. The mask includes a corner that corresponds to an angle of between ninety and one hundred eighty degrees. Thus, the mask includes an obtuse angle. In addition, the mask includes at least one rectangular serif. At least one of the serif(s) resides at the corner. The pattern in the mask is optically transferred from the mask to a resist layer to provide a resist mask, via step 104. A portion of the magnetic recording transducer is formed using the resist mask, via step 106. For example, A PMR pole may be formed using the resist mask in step 106. In such an embodiment, the resist mask may include a trench that is defined using the mask. The trench may be used in forming the PMR pole. Alternatively, the mask and the resist mask may be used in forming other structures, such as conductive lines.

Because of the use of the rectangular serif(s), optical proximity effects can be reduced or eliminated. In particular, rounding of the corner of the resist mask corresponding to the corner of the mask may be reduced. Consequently, the geometry of the structure being formed may be closer to what is desired. For example, a PMR pole formed may have the desired track width and shape. Moreover, this may be accomplished using rectangular serif(s), which are serifs are relatively easy to fabricate because of their shape.

Figure 6:
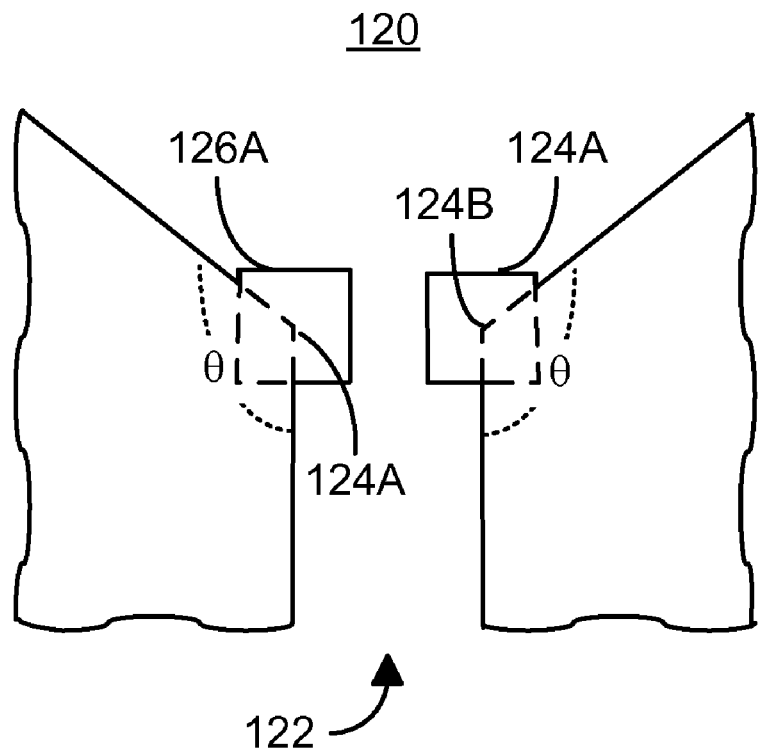
FIG. 6 depicts an exemplary embodiment of a mask used in fabricating structures having an obtuse angle, such as a PMR pole.

FIG. 6 depicts an exemplary embodiment of a mask 120 used in fabricating structures having an obtuse angle, such as a PMR pole. Thus, the mask 120 is preferably used in fabricating the PMR pole. The mask 120 may thus be used in forming a magnetic transducer and may be formed in step 102 of the method 100. The edges of the mask 120 are shown in solid lines. For clarity of explanation, portions of the shapes forming the serif are shown in dashed lines.

The mask 120 has an aperture 122 and includes corners 124A and 124B, each of which has a flare angle, θ, associated with it. The flare angle, θ, is greater than ninety degrees and less than one hundred eighty degrees. More preferably, the flare angle is at least one hundred ten degrees and not more than one hundred sixty degrees. The mask 120 also includes rectangular serifs 126A and 126B residing at the corners 124A and 124B, respectively. In a preferred embodiment, the serifs 126A and 126B are squares. Also in a preferred embodiment, the serifs 126A and 126B are substantially identical. Each of the serifs 126A and 126B has a side of length at least thirty nanometers and not more than one hundred nanometers. In a preferred embodiment, each of the serifs 126A and 126B has a side of length at least sixty-five nanometers and not more than seventy-five nanometers. In general, the size of the serif 126A/126B varies with the size of the flare angle, θ. The size of the serif 126A/126B generally decreases as the angle increases. The center of each serif 126A and 126B preferably resides at the apex of the corner 134A and 134B, respectively.

Figure 7:
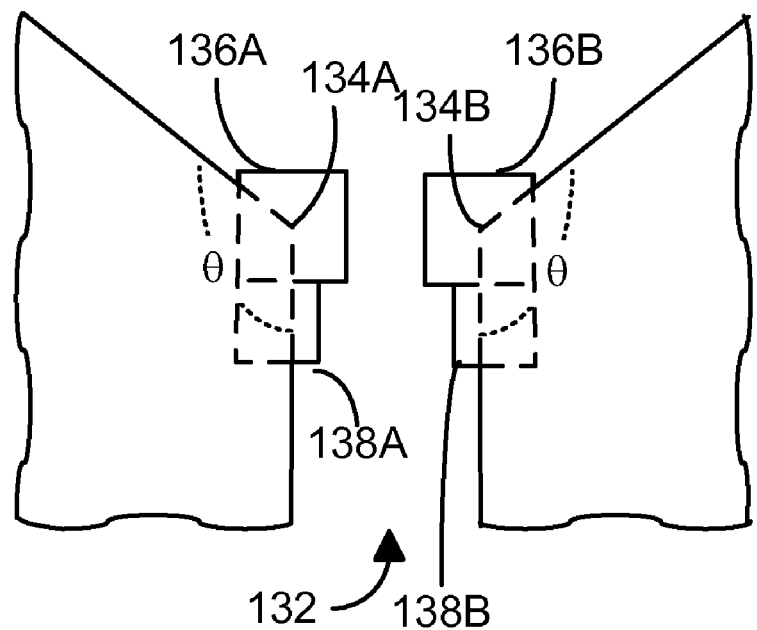
FIG. 7 depicts another exemplary embodiment of a mask used in fabricating structures having an obtuse angle, such as a PMR pole.

FIG. 7 depicts another exemplary embodiment of a mask 130 used in fabricating structures having an obtuse angle, such as a PMR pole. Thus, the mask 130 is preferably used in fabricating the PMR pole. The mask 130 is thus preferably used in forming a magnetic transducer and may be formed in step 102 of the method 100. The edges of the mask 130 are shown in solid lines. For clarity of explanation, portions of the shapes forming the serif are shown in dashed lines. In addition, portions of the mask 130 are analogous to the mask 120 and, therefore, are labeled similarly. For example, the mask 130 includes corners 134A and 134B that are analogous to the corners 124A and 124B, respectively.

The mask 130 includes an aperture 132 and corners 134A and 134B, each of which has a flare angle, θ, associated with it. The flare angle θ, is greater than ninety degrees and less than one hundred eighty degrees. Consequently, the flare angle is obtuse. More preferably, the flare angle is at least one hundred ten degrees and not more than one hundred sixty degrees. The mask 130 also includes a rectangular serifs 136A and 136B and 138A and 138B. The serifs 136A and 136B reside at the corners 134A and 134B. In a preferred embodiment, the serifs 136A and 136B are squares and are substantially identical. In one embodiment, each of the serifs 136A and 136B has a side of length at least thirty nanometers and not more than one hundred nanometers. In a preferred embodiment, each of the serifs 136A and 136B has a side of length at least sixty-five nanometers and not more than seventy-five nanometers for a mask with critical dimensions of approximately one hundred eighty nanometers. In general, the size of the serif 136A/136B varies with the size of the flare angle, θ. The size of the serif 136A/136B generally decreases as the angle increases. Also in a preferred embodiment, the serif 136A or 136B is located such that the center of the serif 136A or 136B, respectively is at the apex of the corner 134A or 134B respectively.

The mask 130 also includes rectangular serifs 138A and 138B. In a preferred embodiment, the serifs 138A and 138B are preferably substantially the same size as the serifs 136A and 136B, respectively. However, in another embodiment, the serifs 136A and 136B may have a different size than the serifs 138A and 138B. Also in a preferred embodiment, the outer edge of the serifs 138A and 138B are halfway between the center of the serifs 136A and 136B, respectively, and the edge of the serifs 136A and 136B, respectively. Thus, in a preferred embodiment, the edge of the serifs 138A/138B is halfway between the edge of the serif 136A/136B, respectively, and the vertical edge of the aperture 132.

Figure 8:
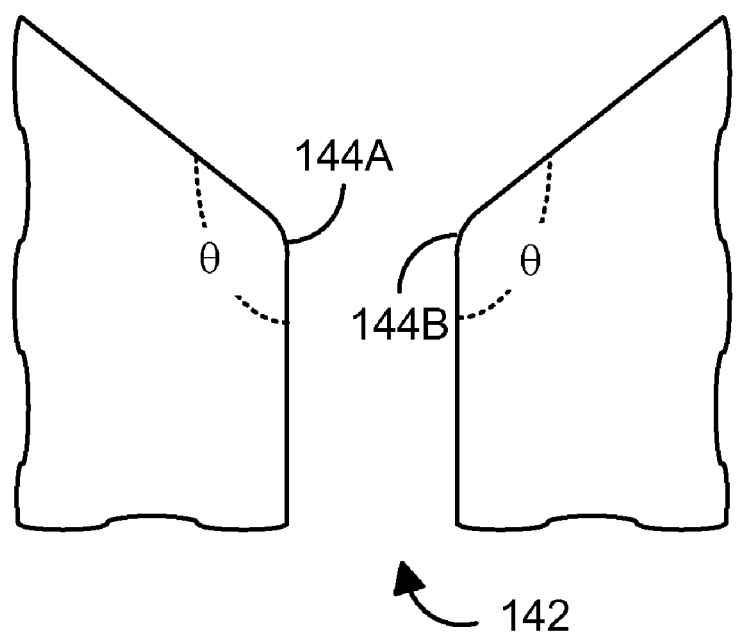
FIG. 8 depicts an exemplary embodiment of a photoresist mask used in fabricating structures having an obtuse angle, such as a PMR pole and formed using an exemplary embodiment of the mask.

The masks 120 and, more particularly, 130 provide optical proximity correction. This can be seen in a resist mask formed from the masks 120 and/or 130. FIG. 8 depicts an exemplary embodiment of a resist mask 140 used in fabricating structures having an obtuse angle, such as a PMR pole and formed using an exemplary embodiment of the mask 120/130. Thus, the resist mask 140 may be formed in step 104 of the method 100 depicted in FIG. 5. Referring back to FIGS. 6-8, the resist mask 140 includes a trench 142 corresponding to the aperture 122/132. In addition, the resist mask 140 includes corners 144A and 144B corresponding to corners 124A/134A and 124B/134B, respectively.

Because of the use of the rectangular serif(s) 126A/136A, 126B/136B, 138A and 138B, optical proximity effects may be reduced or eliminated. In particular, rounding of the corner 144A/144B of the resist mask 140 may be significantly reduced. Consequently, the geometry of the structure being formed may be closer to what is desired. Structures formed using the resist mask 140 may have a geometry closer to the desired configuration. Consequently, performance and/or reliability of the magnetic transducer formed. In addition, rectangular serifs 126A/126B, 136A/136B, and 138A/138B may be relatively easily and repeatably formed. Consequently, the benefits of the masks 120 and 130 may be achieved relatively simply.

Figure 9:
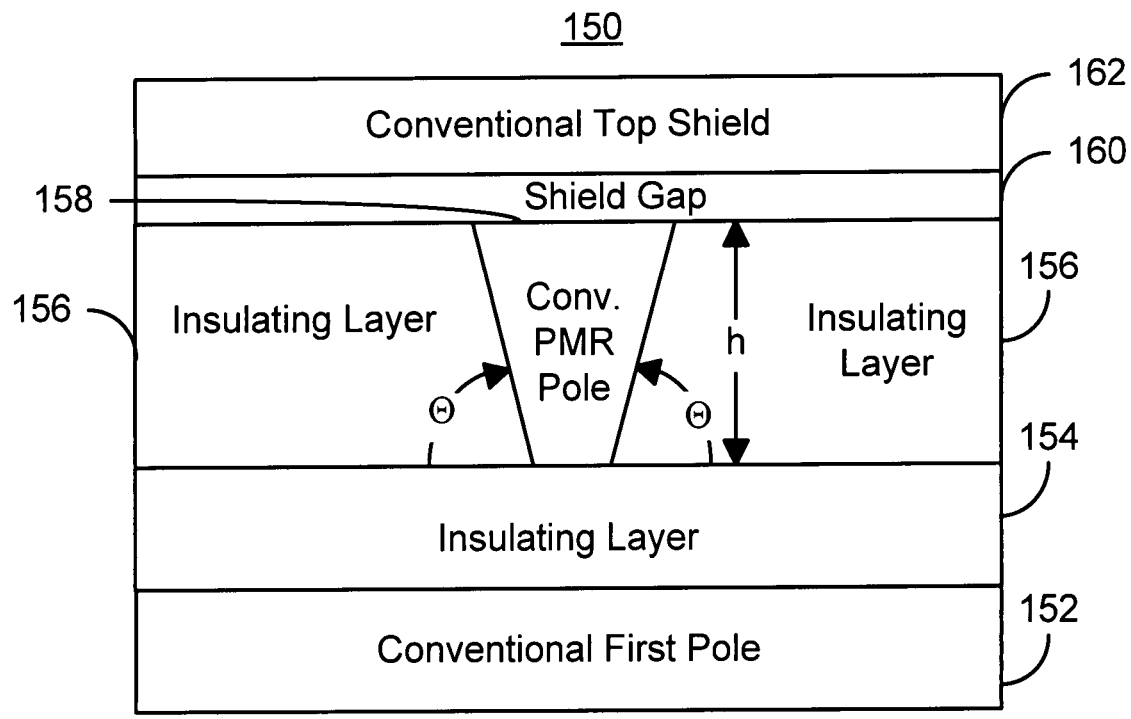
FIG. 9 depicts an ABS view of an exemplary embodiment of a PMR transducer.
Figure 10:
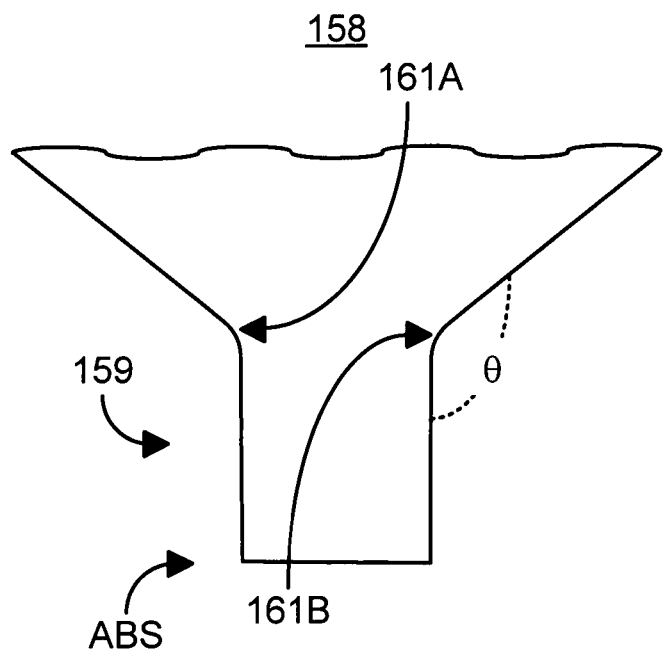
FIG. 10 depicts a top view of an exemplary embodiment of a PMR pole.

For example, FIGS. 9-10 depict exemplary embodiments of a PMR transducer 150 formed using the masks 120/130, resist mask 140, and the method 100. FIG. 9 depicts an ABS view of an exemplary embodiment of a PMR transducer 150. FIG. 10 depicts a top view of an exemplary embodiment of THE PMR pole. The PMR transducer 150 is typically used as a write head in a merged head including the PMR transducer 150 and a read head. The PMR transducer 150 includes a P1 152, insulator 154, insulator 156, a PMR pole (main pole) 158, write gap 160, and shield 162. The PMR pole 158 has a negative angle, Θ. Thus, the top of the PMR pole 158 is wider than the bottom of the PMR pole 158. Near the ABS, the PMR pole 158 terminates in a nose 19. The PMR pole 158 thus flares outward from the nose 159 at a flare angle, θ, forming corners 161A and 161B. The flare angle is preferably between approximately one hundred ten degrees and one hundred sixty degrees, and more preferably approximately one hundred and fifty degrees.

Because of the use of the rectangular serif(s) 126A/136A, 126B/136B, 138A and 138B, optical proximity effects may be reduced or eliminated for the PMR pole 158. In particular, the corners 161A and 161B of the PMR pole may have significantly less rounding. Consequently, the geometry of the nose 159 may be closer to what is desired. Thus, the control of the track width of the PMR transducer 150 and the geometry of the nose 159 may be improved. Consequently, performance and/or reliability of the magnetic transducer formed. Furthermore, the method 100, masks 120/130, and resist mask 140 may be extended to other structures in a magnetic recording transducer which include corners having angles that are between ninety degrees and one hundred eighty degrees. As a result, performance of the magnetic transducer may be further enhanced.

A method and system for providing a mask and, therefore, a portion of a magnetic recording transducer has been disclosed. Using the method and system, a structure having sharper corners, improved geometry control and, therefore, a better defined track width has been described.

We claim:

1. A mask for transferring a pattern for portion of a magnetic recording transducer comprising:
   a one corner corresponding to an angle having a size of more than ninety degrees and less than one hundred eighty degrees;
   at least one rectangular serif residing at the corner and having at least one side length that is based on the size of the angle wherein the corner has an apex and wherein the at least one rectangular serif includes a first serif having a first center at the apex.

2. The mask of claim 1 wherein the at least one rectangular serif includes at least one square serif.

3. The mask of claim 1 wherein the at least one square serif has a side length of at least thirty nanometers and not more than one hundred nanometers.

4. The mask of claim 3 wherein the at least one square serif has a side length of at least sixty-five nanometers and not more than seventy-five nanometers.

5. The mask of claim 1 wherein the first serif has a first edge and wherein the at least one rectangular serif includes a second serif having a second edge located between the first center and the first edge.

6. The mask of claim 5 wherein the second edge is located one-half way between the first center and the first edge.

7. The mask of claim 1 wherein the corner is at least one hundred ten degrees and not more than one hundred sixty degrees.

8. The mask of claim 1 wherein the magnetic recording transducer includes a perpendicular magnetic recording transducer.

9. A mask for transferring a pattern for portion of a perpendicular magnetic recording transducer comprising:
   a corner having an apex and corresponding to an angle of at least one hundred ten degrees and not more than one hundred sixty degrees;
   a pair of square serifs residing at the corner, a first serif of the pair of square serifs having a first center at the apex, a first edge, and a second edge, a second serif of the pair of serifs having a third edge residing half-way between the first center and the second edge and, the first serif and the second serif having a side length of at least thirty nanometers and not more than one hundred nanometers, the side length being smaller for the angle being larger.

10. A method for transferring a pattern for portion of a magnetic recording transducer comprising:
    providing a mask including a corner and at least one rectangular serif, the corner corresponding to an angle having a size of more than ninety degrees and less than one hundred eighty degrees, the at least one rectangular serif residing at the corner and having at least one side length that is based on the size of the angle wherein the corner has an apex and wherein the at least one rectangular serif includes a first serif having a first center at the apex;
    optically transferring the pattern from the mask to a resist layer to provide a resist mask; and
    forming the portion of the magnetic recording transducer using the resist mask.

11. The method of claim 10 wherein the mask providing further includes:
    providing at least one square serif as the rectangular serif.

12. The method of claim 10 wherein the at least one square serif providing further includes:
    providing the at least one square serif having a side length of at least thirty nanometers and not more than one hundred nanometers.

13. The method of claim 12 wherein the at least one square serif providing further includes:
    providing the at least one square serif having a side length of at least sixty-five nanometers and not more than seventy-five nanometers.

14. The method of claim 10 wherein the first serif has a first edge and wherein the at least one rectangular serif includes a second serif having a second edge located between the first center and the first edge.

15. The method of claim 14 wherein the second edge is located one-half way between the first center and the first edge.

16. The method claim 10 wherein the corner is at least one hundred ten degrees and not more than one hundred sixty degrees.

17. The method of claim 10 wherein the magnetic recording transducer includes a perpendicular magnetic recording transducer.

18. The mask of claim 1 wherein the at least one side length is smaller if the size of the angle is larger.

19. The method of claim 10 wherein the at least one side length is smaller if the size of the angle is larger.

* * * * *